(12) United States Patent
Moran et al.

(10) Patent No.: US 9,871,167 B2
(45) Date of Patent: Jan. 16, 2018

(54) TOP EMITTING SEMICONDUCTOR LIGHT EMITTING DEVICE

(71) Applicant: KONINKLIJKE PHILIPS N.V., Eindhoven (NL)

(72) Inventors: Brendan Jude Moran, San Jose, CA (US); Marc Andre de Samber, San Jose, CA (US); Grigoriy Basin, San Jose, CA (US); Norbertus Antonius Maria Sweegers, San Jose, CA (US); Mark Melvin Butterworth, San Jose, CA (US); Kenneth Vampola, San Jose, CA (US); Clarisse Mazuir, San Jose, CA (US)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/783,780

(22) PCT Filed: Mar. 31, 2014

(86) PCT No.: PCT/IB2014/060310
§ 371 (c)(1),
(2) Date: Oct. 9, 2015

(87) PCT Pub. No.: WO2014/167455
PCT Pub. Date: Oct. 16, 2014

(65) Prior Publication Data
US 2016/0240735 A1  Aug. 18, 2016

Related U.S. Application Data

(60) Provisional application No. 61/810,833, filed on Apr. 11, 2013, provisional application No. 61/900,466, filed on Nov. 6, 2013.

(51) Int. Cl.
*H01L 33/46* (2010.01)
*H01L 25/075* (2006.01)
(Continued)

(52) U.S. Cl.
CPC .......... *H01L 33/20* (2013.01); *H01L 25/0753* (2013.01); *H01L 33/007* (2013.01);
(Continued)

(58) Field of Classification Search
None
See application file for complete search history.

(56) References Cited

U.S. PATENT DOCUMENTS 6,229,160 B1 * 5/2001 Krames .................. H01L 33/20
257/94
7,361,938 B2 * 4/2008 Mueller .................. C04B 35/44
257/79

(Continued)

FOREIGN PATENT DOCUMENTS

CN  101047220 A  10/2007
CN  101127379 A  2/2008
(Continued)

OTHER PUBLICATIONS

EPO as ISA, PCT/IB2014/060310 filed Mar. 31, 2014, "International Search Report and Written Opinion" dated Oct. 21, 2014, 17 pages.
(Continued)

*Primary Examiner* — Johannes P Mondt

(57) ABSTRACT

Embodiments of the invention include a semiconductor structure including a light emitting layer sandwiched between an n-type region and a p-type region. A growth substrate is attached to the semiconductor structure. The growth substrate has at least one angled sidewall. A reflective layer is disposed on the angled sidewall. A majority of
(Continued)

light extracted from the semiconductor structure and the growth substrate is extracted through a first surface of the growth substrate.

17 Claims, 4 Drawing Sheets

(51) Int. Cl.
| | |
|---|---|
| H01L 33/20 | (2010.01) |
| H01L 33/44 | (2010.01) |
| H01L 33/06 | (2010.01) |
| H01L 33/32 | (2010.01) |
| H01L 33/50 | (2010.01) |
| H01L 33/56 | (2010.01) |
| H01L 33/62 | (2010.01) |
| H01L 33/00 | (2010.01) |

(52) U.S. Cl.
CPC .......... *H01L 33/0079* (2013.01); *H01L 33/06* (2013.01); *H01L 33/32* (2013.01); *H01L 33/44* (2013.01); *H01L 33/46* (2013.01); *H01L 33/465* (2013.01); *H01L 33/502* (2013.01); *H01L 33/56* (2013.01); *H01L 33/62* (2013.01); *H01L 33/0095* (2013.01); *H01L 2933/005* (2013.01); *H01L 2933/0025* (2013.01); *H01L 2933/0041* (2013.01); *H01L 2933/0066* (2013.01); *H01L 2933/0091* (2013.01)

(56) References Cited

U.S. PATENT DOCUMENTS

| | | | | |
|---|---|---|---|---|
| 7,789,531 | B2* | 9/2010 | Duong | .................... H01L 33/20 362/257 |
| 8,114,689 | B2 | 2/2012 | Kang et al. | |
| 8,236,582 | B2 | 8/2012 | Neff et al. | |
| 8,324,797 | B2* | 12/2012 | Shylo | ..................... H01L 33/56 257/98 |
| 2004/0076016 | A1* | 4/2004 | Sato | ........................ H01L 33/20 362/555 |
| 2007/0228391 | A1 | 10/2007 | Minami et al. | |
| 2008/0210966 | A1* | 9/2008 | Sakamoto | ............... H01L 33/46 257/98 |
| 2010/0279437 | A1* | 11/2010 | Neff | .................... H01L 33/0095 438/14 |
| 2010/0295070 | A1* | 11/2010 | Su | ........................ H01L 25/0753 257/91 |
| 2011/0198665 | A1 | 8/2011 | Furukawa | |

FOREIGN PATENT DOCUMENTS

| | | |
|---|---|---|
| CN | 101188268 A | 5/2008 |
| CN | 102439739 A | 5/2012 |
| EP | 1341991 A2 | 9/2003 |
| EP | 1411557 A2 | 4/2004 |
| EP | 2511965 A2 | 10/2012 |
| WO | WO-0241362 A2 | 5/2002 |
| WO | WO-2006043796 A1 | 4/2006 |

OTHER PUBLICATIONS

Article 94(3) EPC dated Mar. 2, 2017, European Patent Application No. 14716970.0, LUM Reference No. 2013P00698WE, 6 pages.
Taiwan Office Action dated Jul. 5, 2017, Taiwan Patent Application No. 103113487, 11 pages.
CN First Office Action dated Jul. 21, 2017, China Patent Application No. 201480033532.3, 19 pages.

* cited by examiner

TOP EMITTING SEMICONDUCTOR LIGHT EMITTING DEVICE

The present application is a § 371 application of International Application No. PCT/IB2014/060310 filed on Mar. 31, 2014 and entitled "Top emitting semiconductor light emitting device," which claims the benefit of U.S. Provisional Application Ser. No. 61/810,833, filed on Apr. 11, 2013, and U.S. Provisional Application Ser. No. 61/900,466, filed on Nov. 6, 2013.

FIELD OF THE INVENTION

The present invention relates to top-emitting, wavelength-converted semiconductor light emitting devices.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

LEDs that emit light only from a surface that is commonly referred to as the "top" surface (i.e. devices where light emission from the side surfaces of the LED is substantially reduced or eliminated) are often formed by growing an LED semiconductor structure on a growth substrate, attaching the semiconductor structure to a mount, then removing the growth substrate.

SUMMARY

It is an object of the invention to provide a device that emits a majority of light from the top surface of the device, without requiring removal of the growth substrate.

Embodiments of the invention include a semiconductor structure including a light emitting layer sandwiched between an n-type region and a p-type region. A growth substrate is attached to the semiconductor structure. The growth substrate has at least one angled sidewall. A reflective layer is disposed on the angled sidewall. A majority of light extracted from the semiconductor structure and the growth substrate is extracted through a top surface of the growth substrate.

Embodiments of the invention include a semiconductor structure including a light emitting layer sandwiched between an n-type region and a p-type region. A growth substrate having a thickness less than 150 microns is attached to the semiconductor structure. A reflective layer is disposed on a sidewall of the growth substrate and a sidewall of the semiconductor structure. A majority of light extracted from the semiconductor structure and the growth substrate is extracted through a top surface of the growth substrate.

A method according to embodiments of the invention includes attaching a plurality of semiconductor light emitting devices to a carrier. A reflective material is disposed in areas between the semiconductor light emitting devices. Two neighboring semiconductor light emitting devices are separated. Separating includes cutting the reflective material.

DETAILED DESCRIPTION

In embodiments of the invention, wafers of semiconductor LEDs grown on a growth substrate are processed into individual devices or groups of devices where a majority of light is extracted through a top surface of each LED. A reflective material is disposed on the sides of the device to prevent light from escaping from the sides of the device, or to reduce the amount of light extracted from the sides of the device. The reflective material may also increase the amount of light extracted through the top surface of the LED.

Though in the examples below the semiconductor light emitting devices are III-nitride LEDs that emit blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

Figure 1:
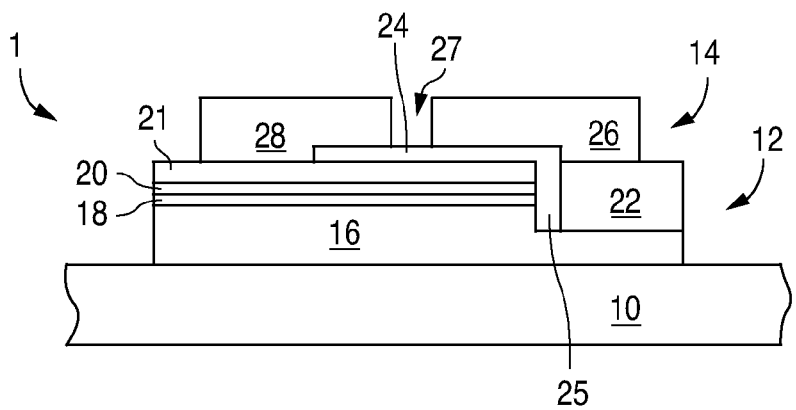
FIG. 1 illustrates one example of a III-nitride LED.

FIG. 1 illustrates a III-nitride LED that may be used in embodiments of the present invention. Any suitable semiconductor light emitting device may be used and embodiments of the invention are not limited to the device illustrated in FIG. 1. The device of FIG. 1 is formed by growing a III-nitride semiconductor structure 12 on a growth substrate 10 as is known in the art. The growth substrate is often sapphire but may be any suitable substrate such as, for example, SiC, Si, GaN, or a composite substrate. A surface of the growth substrate on which the III-nitride semiconductor structure is grown may be patterned, roughened, or textured before growth, which may improve light extraction from the device. A surface of the growth substrate opposite the growth surface (i.e. the surface through which a majority of light is extracted in a flip chip configuration) may be patterned, roughened or textured before or after growth, which may improve light extraction from the device.

The semiconductor structure includes a light emitting or active region sandwiched between n- and p-type regions. An n-type region 16 may be grown first and may include multiple layers of different compositions and dopant concentration including, for example, preparation layers such as buffer layers or nucleation layers, which may be n-type or not intentionally doped, and n- or even p-type device layers designed for particular optical, material, or electrical properties desirable for the light emitting region to efficiently emit light. A light emitting or active region 18 is grown over the n-type region. Examples of suitable light emitting regions include a single thick or thin light emitting layer, or a multiple quantum well light emitting region including multiple thin or thick light emitting layers separated by barrier layers. A p-type region 20 may then be grown over the light emitting region. Like the n-type region, the p-type region may include multiple layers of different composition, thickness, and dopant concentration, including layers that are not intentionally doped, or n-type layers.

After growth, a p-contact is formed on the surface of the p-type region. The p-contact 21 often includes multiple conductive layers such as a reflective metal and a guard metal which may prevent or reduce electromigration of the reflective metal. The reflective metal is often silver but any suitable material or materials may be used. After forming the p-contact 21, a portion of the p-contact 21, the p-type region 20, and the active region 18 is removed to expose a portion of the n-type region 16 on which an n-contact 22 is formed. The n- and p-contacts 22 and 21 are electrically isolated from each other by a gap 25 which may be filled with a dielectric such as an oxide of silicon or any other suitable material. Multiple n-contact vias may be formed; the n- and p-contacts 22 and 21 are not limited to the arrangement illustrated in FIG. 1. The n- and p-contacts may be redistributed to form bond pads with a dielectric/metal stack, as is known in the art.

In order to form electrical connections to the LED, one or more interconnects 26 and 28 are formed on or electrically connected to the n- and p-contacts 22 and 21. Interconnect 26 is electrically connected to n-contact 22 in FIG. 1. Interconnect 28 is electrically connected to p-contact 21. Interconnects 26 and 28 are electrically isolated from the n- and p-contacts 22 and 21 and from each other by dielectric layer 24 and gap 27. Interconnects 26 and 28 may be, for example, solder, stud bumps, gold layers, or any other suitable structure. Many individual LEDs are formed on a single wafer then diced from the wafer of devices. The semiconductor structure and the n- and p-contacts 22 and 21 of a wafer of LEDs are represented in the following figures by block 12. The interconnects 26 and 28 of a wafer of LEDs are represented by block 14.

The substrate 10 may be thinned after growth of the semiconductor structure or after forming the individual devices as described above in reference to FIG. 1. After thinning, the substrate may be at least 50 µm thick in some embodiments, no more than 150 µm thick in some embodiments, at least 80 µm thick in some embodiments and no more than 120 µm thick in some embodiments.

FIGS. 2, 3, 4, 5, and 6 illustrate forming a device according to embodiments of the invention.

Figure 2:
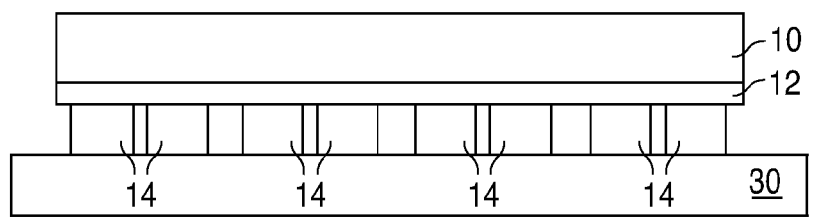
FIG. 2 illustrates a wafer of LEDs attached to a temporary carrier.

In FIG. 2, before the wafer of LEDs is diced into individual LEDs or groups of LEDs, the wafer is attached to a temporary carrier 30 through the interconnects 14. The temporary carrier 30 stabilizes the wafer for the following processing steps. Temporary carrier 30 may be any suitable material such as, for example, wafer handling tape.

Figure 3:
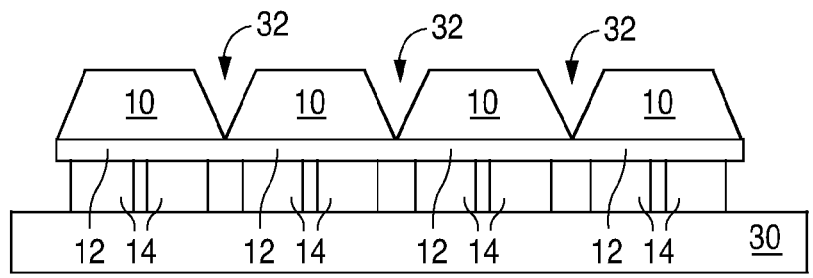
FIG. 3 illustrates the structure of FIG. 2 after forming slots in the growth substrate.

In FIG. 3, slots 32 are formed in the growth substrate 10. Slots 32 are no more than 50 µm wide (for example, at the top of a slot with an angled sidewall as illustrated in FIG. 3) in some embodiments. The slots are disposed in the region between LEDs where the structure will be cut, as described below, to separate the wafer into individual LEDs or groups of LEDs. The slots may be formed by any suitable technique including, for example, wet or dry etching, laser scribing, or mechanical cutting such as sawing with a diamond blade. The slots 32 may extend through the entire thickness of substrate 10, though they need not. The slots 32 may have angled sidewalls, as illustrated in FIG. 3, though angled sidewalls are not required.

Figure 4:
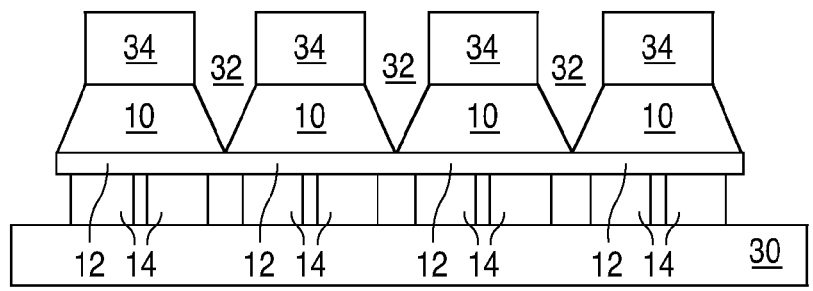
FIG. 4 illustrates the structure of FIG. 3 after attaching wavelength converting members to the LEDs.

In FIG. 4, wavelength converting members 34 are attached to the top of substrate 10, such that the wavelength converting members are aligned with individual LEDs or groups of LEDs. Wavelength converting members 34 are generally wavelength converting structures that are formed separately from the wafer of LEDs, then attached to the substrate 10. As such, wavelength converting members 34 are self-supporting structures, not structures that are formed in situ on the substrate 10. Examples of suitable wavelength converting members 34 include phosphor that is formed into ceramic platelets, for example by sintering, and/or a phosphor or other wavelength converting material disposed in a transparent material, such as glass, silicone, or epoxy, that is cast or otherwise formed into a sheet, then cut into individual wavelength converting members 34.

The wavelength converting material in wavelength converting members 34 may be, for example, conventional phosphors, organic phosphors, quantum dots, organic semiconductors, II-VI or III-V semiconductors, II-VI or III-V semiconductor quantum dots or nanocrystals, dyes, polymers, or other materials that luminesce. The wavelength converting material absorbs light emitted by the LED and emits light of one or more different wavelengths. Unconverted light emitted by the LED is often part of the final spectrum of light extracted from the structure, though it need not be. Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting materials, and a UV-emitting LED combined with blue-, green-, and red-emitting wavelength converting materials. Wavelength converting materials emitting other colors of light may be added to tailor the spectrum of light emitted from the structure.

Wavelength converting member 34 may be attached to substrate 10 by, for example, gluing with a material such as silicone or any other suitable adhesive, direct bonding, or any other suitable technique.

Figure 5:
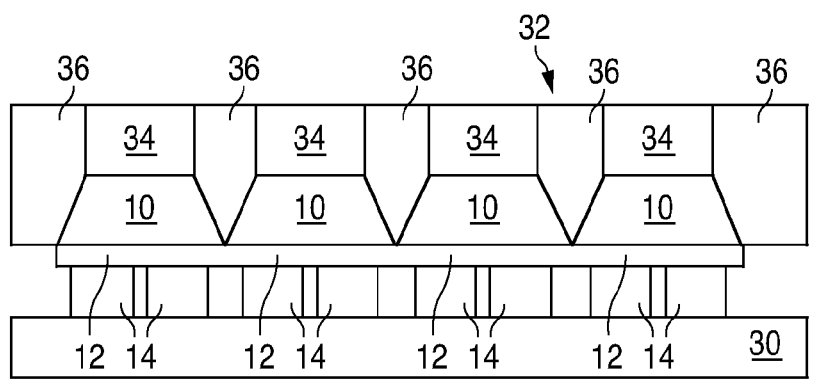
FIG. 5 illustrates the structure of FIG. 4 after filling the areas between the LEDs with reflective material.

In FIG. 5, a reflective material 36 is disposed in the slots 32 formed in FIG. 3. Reflective material may be, for example, reflective or other particles disposed in a transparent material. The particles and transparent material may be selected to have substantially different indices of refraction in order to cause optical scattering. In some embodiments, the transparent material has a low index (for example, silicone may have an index of refraction of 1.4 or less) and the particles have a higher index (for example, $TiO_2$ has an index of refraction of 2.6). Any suitable reflective particle may be used, including, for example, $TiO_2$, ZnO, or $Al_2O_3$. Examples of suitable transparent materials include silicone molding compound, liquid silicone, epoxy, and glass. In some embodiments, the reflective particles, the transparent material, and/or the combination of reflective particles and transparent material has a higher thermal conductivity than common silicone materials. Common silicone materials typically have a thermal conductivity around 0.1-0.2 W/mK.

Reflective material 36 may be disposed in the slots 32 by any suitable technique such as, for example, dispensing or molding. Reflective material 36 may completely fill slots 32, as illustrated in FIG. 5, such that the top of the reflective material 36 is coplanar with the tops of wavelength converting members 34 in some embodiments. Reflective material 36 does not completely fill slots 32 in some embodiments. In some embodiments, excessive reflective material 36 is removed after disposing the reflective material 36 in the slots. For example, reflective material that extends above the tops of slots 32, or that covers the LEDs, may be removed by any suitable technique, such as mechanical abrasion, grinding, or microbead blasting.

Figure 6:
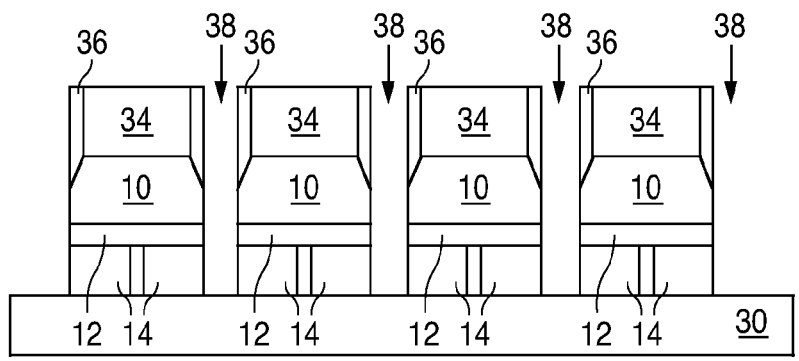
FIG. 6 illustrates the structure of FIG. 5 after separating the LEDs.

In FIG. 6, individual LEDs are separated from the wafer by cutting through the reflective material 36 and the LED wafer in the regions 38 between LEDs. Individual LEDs may be cut from the wafer by any suitable technique including, for example, diamond sawing, laser cutting, or scribing and breaking. The kerf formed by cutting may be, for example, no more than 20 µm wide. The necessary thickness of reflective material 36 remaining on the sides of the LEDs in FIG. 6 after cutting, for proper functioning of the reflective material, may depend on the type of reflective material. For reflective metal films, no more than 1 µm is required in some embodiments. For diffuse reflectors such as $TiO_2$ in silicone, the reflectivity may depend on the thickness. For example, a diffuse reflector that is at least 90% reflective may be 20 µm thick or less in some embodiments and a diffuse reflector that is at least 95% reflective may be 50 µm thick or less in some embodiments.

After cutting, the finished LEDs are removed from the temporary carrier 30 by any suitable technique such as, for example, thermal release, transfer to a different carrier, or direct picking.

Figure 7:
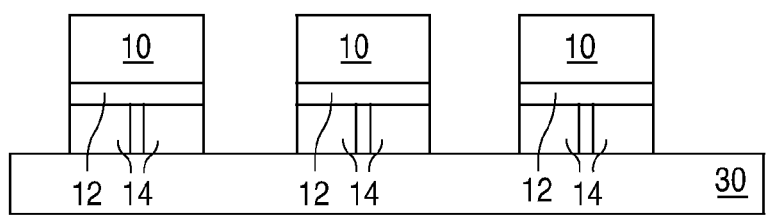
FIG. 7 illustrates LEDs attached to a temporary carrier.
Figure 8:
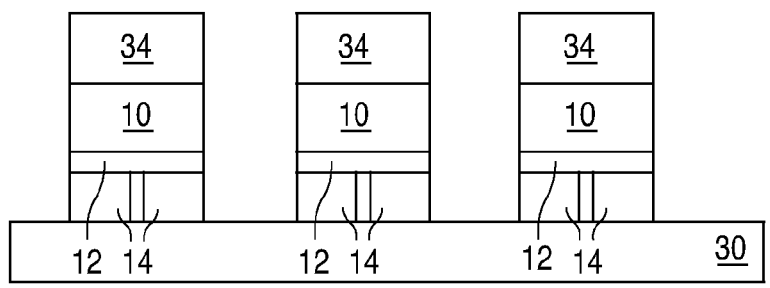
FIG. 8 illustrates the structure of FIG. 7 after attaching wavelength converting members to the LEDs.
Figure 9:
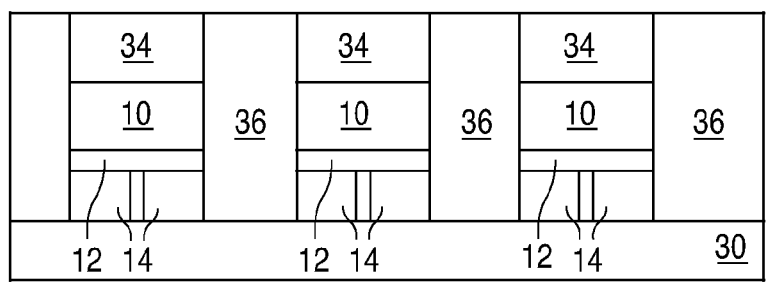
FIG. 9 illustrates the structure of FIG. 8 after filling the areas between the LEDs with reflective material.

One disadvantage of the method and resulting device illustrated in FIGS. 2-6 is that the available area for wavelength converting member 34 and reflective material 36 is limited by the original pitch of the LEDs on the growth substrate wafer 10. The area between neighboring LEDs is limited, for example for cost reasons, which limits the size of wavelength converting member 34 and the thickness of reflective material 36. FIGS. 7, 8, and 9 illustrate an alternative embodiment, where individual LEDs are first separated from a wafer, then rearranged with larger pitch on a temporary carrier.

In FIG. 7, individual LEDs are placed on a carrier 30, which may be a temporary carrier such as those described above in reference to FIG. 2. The LEDs may be spaced at least 100 µm apart in some embodiments, no more than 800 µm apart in some embodiments, at least 400 µm apart in some embodiments, and no more than 600 µm apart in some embodiments. The growth substrate 10 on each LED may have substantially vertical sidewalls, rather than the angled sidewalls illustrated in the embodiment described in FIGS. 2-6, though vertical sidewalls are not required and the shape of the sidewall may depend on the technique used to separate the LEDs.

In FIG. 8, wavelength converting elements 34 are attached to the growth substrate 10 of each LED, as described above in reference to FIG. 4.

In FIG. 9, reflective material 36 is disposed in the gaps between the LEDs, as described above in reference to FIG. 5. The individual devices may be separated by cutting the reflective material, as described above in reference to FIG. 6, then removed from the temporary carrier, as described above in reference to FIG. 6.

Figure 10:
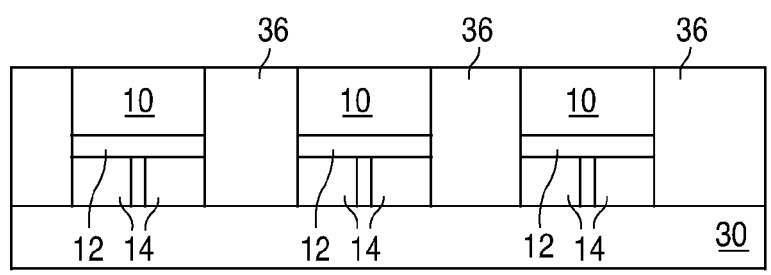
FIG. 10 illustrates the structure of FIG. 7 after filling the areas between the LEDs with reflective material.
Figure 11:
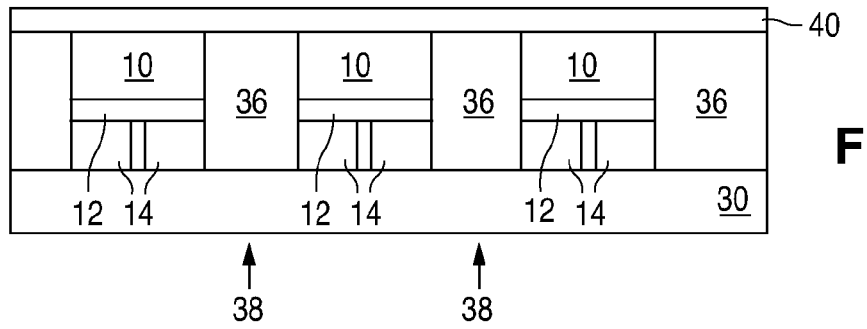
FIG. 11 illustrates the structure of FIG. 10 after forming a wavelength converting layer over the LEDs.

FIGS. 10 and 11 illustrate an alternative embodiment where individual LEDs are first separated from a growth wafer, then disposed on a temporary carrier. In FIG. 10, individual LEDs are placed on a carrier 30 (as illustrated in FIG. 7), which may be a temporary carrier such as those described above in reference to FIG. 2. Reflective material 36 is disposed in the regions between the LEDs, as described above in reference to FIG. 5.

In FIG. 11, a wavelength converting layer 40 is formed over the LEDs and the reflective material 36. Wavelength converting layer 40 may be, for example, a phosphor disposed in a transparent material such as silicone. Wavelength converting layer 40 may be formed by any suitable technique including, for example, lamination, molding, dispensing, spray coating, or spin coating. The LEDs are then separated by cutting through the structure, for example in regions 38 between neighboring LEDs, as described above in reference to FIG. 6. The LEDs are then removed from the temporary carrier 30, as described above in reference to FIG. 6.

Figure 12:
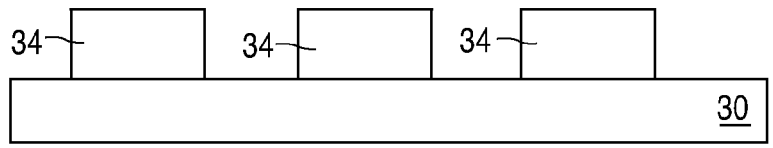
FIG. 12 illustrates wavelength converting members attached to a temporary carrier.
Figure 13:
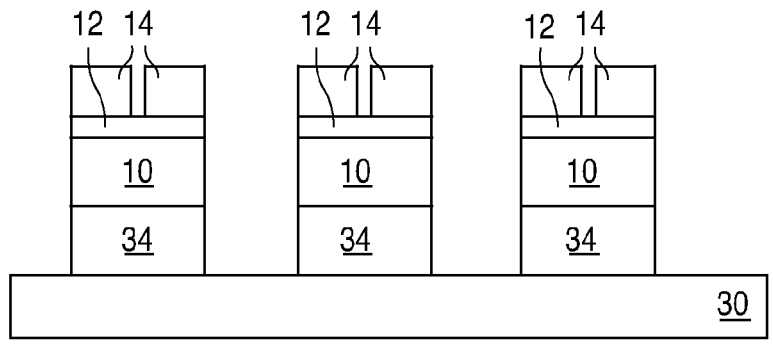
FIG. 13 illustrates the structure of FIG. 12 after attaching LEDs to the wavelength converting members.
Figure 14:
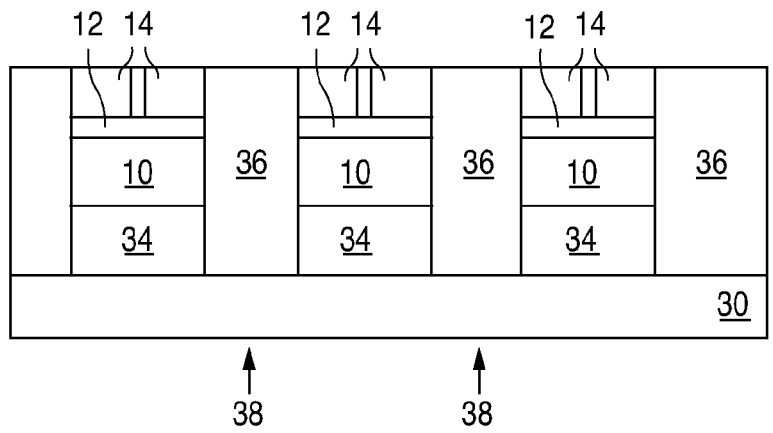
FIG. 14 illustrates the structure of FIG. 13 after filling the areas between the LEDs with reflective material.

FIGS. 12, 13, and 14 illustrate an alternative embodiment. In FIG. 12, individual wavelength converting elements 34 are placed on a carrier 30, which may be a temporary carrier such as those described above in reference to FIG. 2. The wavelength converting elements 34 are described above in reference to FIG. 4.

In FIG. 13, LEDs are attached to the wavelength converting elements 34. The LEDs may be attached using the methods and materials described above in reference to FIG. 4.

In FIG. 14, a reflective material 36 is disposed in the regions between the LEDs, as described above in reference to FIG. 5. The LEDs are then separated by cutting through the structure, for example in regions 38 between neighboring LEDs, as described above in reference to FIG. 6. The LEDs are then removed from the temporary carrier 30, as described above in reference to FIG. 6.

Figure 15:
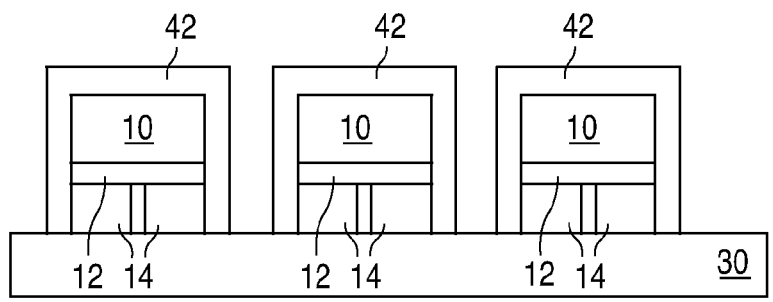
FIG. 15 illustrates LEDs with a substantially conformal wavelength converting layer attached to a temporary carrier.
Figure 16:
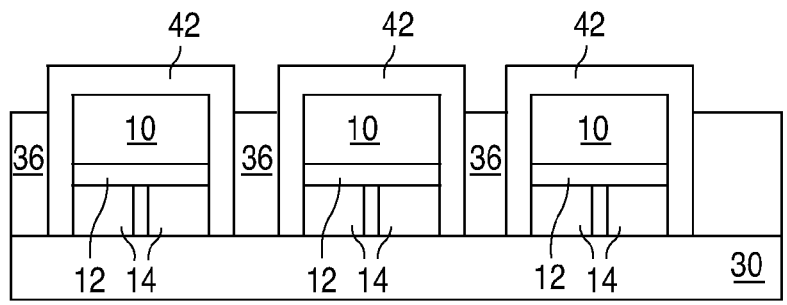
FIG. 16 illustrates the structure of FIG. 15 after filling the areas between the LEDs with reflective material.

FIGS. 15 and 16 illustrate an alternative embodiment. In FIG. 15, LEDs are attached to a temporary carrier 30, which may be a temporary carrier such as those described above in reference to FIG. 2. Before or after attaching the LEDs to the temporary carrier 30, the tops of the LEDs in some embodiments, and the tops and sides of the LEDs in some embodiments, are covered with a wavelength converting layer 42.

The wavelength converting layer 42 may be, for example, a wavelength converting material mixed with a transparent material, and may be formed by any suitable technique, including, for example, lamination, molding, or electrophoretic deposition.

In FIG. 16, a reflective material 36 is disposed in the regions between the LEDs, as described above in reference to FIG. 5. The reflective material 36 may be formed by a technique that limits damage to the substantially conformal wavelength converting layer 42. One example of a suitable technique is dispensing reflective particles mixed with liquid silicone in the areas between the LEDs, then curing the liquid silicone. The LEDs are then separated by cutting through the structure, for example in regions 38 between neighboring LEDs, as described above in reference to FIG. 6. The LEDs are then removed from the temporary carrier 30, as described above in reference to FIG. 6.

Figure 17:
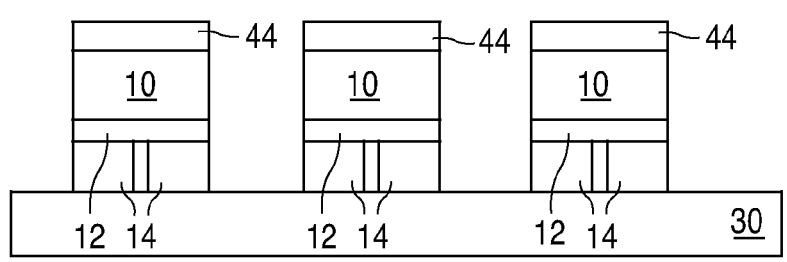
FIG. 17 illustrates LEDs with a mask layer formed over the tops of the LEDs attached to a temporary carrier.

FIGS. 17, 18, 19, and 20 illustrate an alternative embodiment. In FIG. 17, LEDs are attached to a temporary carrier 30, which may be a temporary carrier such as those described above in reference to FIG. 2. Before or after attaching the LEDs to the temporary carrier, the tops of the LEDs are covered with a masking layer 44. In some embodiments, the masking layer is applied to the growth substrate of a wafer of LEDs, before singulating the LEDs by cutting the growth substrate. The masking layer 44 may be, for example, photoresist, dielectric material, or any other suitable material. Masking layer 44 may be formed by any suitable technique, including, for example, spin-coating, roller-coating, dip-coating, lamination, spray-coating, evaporation, sputtering, and direct pick and place of a piece part such as a piece of glass. In some embodiments, the masking layer 44 is patterned, for example, by photolithography, shadow masking, and/or wet or dry chemical etching.

Figure 18:
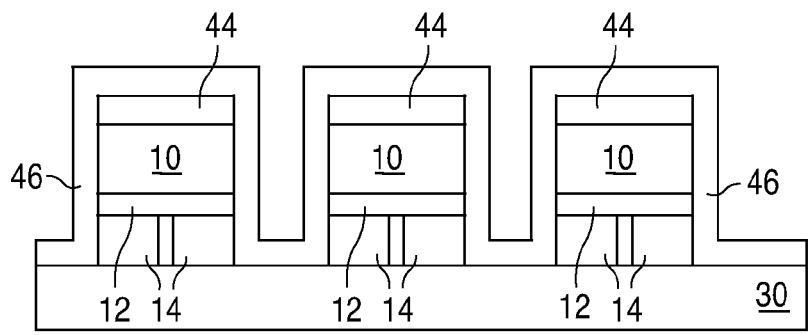
FIG. 18 illustrates the structure of FIG. 17 after forming a reflective layer.

In FIG. 18, a reflective coating 46 is disposed over the structure illustrated in FIG. 17. The reflective coating 46 may be any suitable material including, for example, a dichroic minor, a distributed Bragg reflector (DBR), metallic film, or other suitable dielectric stack. The reflective coating 46 may be formed by any suitable technique including, for example, physical vapor deposition, CVD, sputtering, evaporation, and spray-coating. The reflective coating 46 may substantially conformally coat the structure, as illustrated in FIG. 18, though this is not required.

Figure 19:
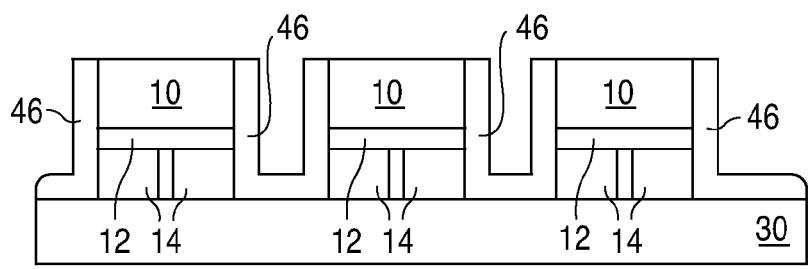
FIG. 19 illustrates the structure of FIG. 18 after removing the mask layer.

In FIG. 19, the masking layer 44 and the reflective coating 46 over the tops of the LEDs are removed by any suitable process such as, for example, a lift-off process. After removing the masking layer 44, reflective coating 46 remains on the sidewalls of the LEDs and the regions between the LEDs.

Figure 20:
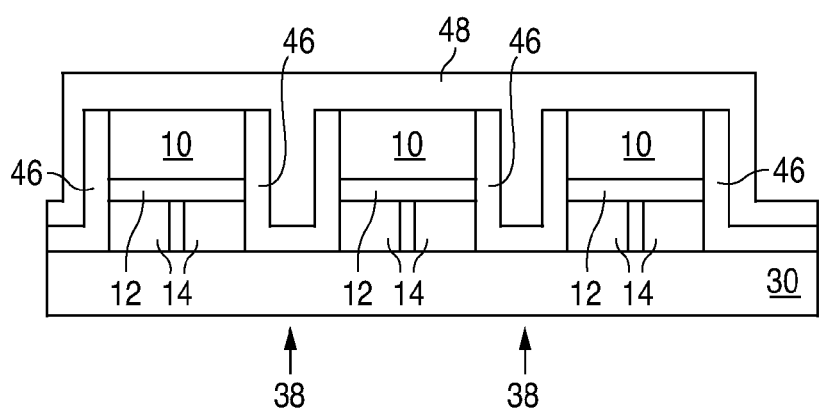
FIG. 20 illustrates the structure of FIG. 19 after forming a wavelength converting layer over the structure.

In FIG. 20, a wavelength converting layer 48 is formed over the structure illustrated in FIG. 19. Wavelength converting layer 48 may be, for example, a wavelength converting material mixed with a transparent material, and may be formed by any suitable technique including, for example, lamination, molding, spray coating, or spin coating. Wavelength converting layer 48 may fill the regions between the LEDs, as illustrated in FIG. 20, or wavelength converting layer 48 may be a substantially conformal layer. The LEDs are then separated by cutting through the structure, for example in regions 38 between neighboring LEDs, as described above in reference to FIG. 6. The LEDs are then removed from the temporary carrier 30, as described above in reference to FIG. 6.

In some embodiments, a lens or other optical element is formed over the finished LED, which may be any of the devices described above. In any of the devices described above, in some embodiments, the sidewalls of the growth substrate may be angled.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:

1. A method comprising:
   growing a semiconductor structure on a growth substrate and forming a plurality of semiconductor light emitting devices on said growth substrate from said semiconductor structure;
   attaching the plurality of semiconductor light emitting devices on the growth substrate to a carrier;
   while the plurality of semiconductor light emitting devices are attached to the carrier, removing a first portion of the growth substrate between the semiconductor light emitting devices while a plurality of second portions of the growth substrate remains on a top surface of the semiconductor light emitting devices;
   disposing a reflective material in areas between the plurality of second portions of the growth substrate;
   separating two neighboring semiconductor light emitting devices, wherein separating comprises cutting the reflective material and the semiconductor structure; and
   after separating two neighboring semiconductor light emitting devices, removing the carrier;
   wherein after said separating two neighboring semiconductor light emitting devices, each semiconductor light emitting device comprises one of the second portions of the growth substrate on which a portion of the semiconductor structure is grown.

2. The method of claim 1 wherein removing a first portion of the growth substrate between the semiconductor light emitting devices while a plurality of second portions of the growth substrate remains on a top surface of the semiconductor light emitting devices comprises forming slots in the growth substrate in areas between the semiconductor light emitting devices, wherein disposing a reflective material in areas between the plurality of second portions of the semiconductor light emitting devices comprises disposing a reflective material in the slots.

3. The method of claim 1 further comprising attaching a wavelength converting member to a top surface of the second portions of growth substrate on each of the plurality of semiconductor light emitting devices prior to disposing a reflective material in areas between the semiconductor light emitting devices, wherein the wavelength converting member is formed separately from the semiconductor light emitting device.

4. A method comprising
   growing a semiconductor structure on a growth substrate;
   forming the semiconductor structure into a plurality of semiconductor light emitting devices, each having a portion of the growth substrate on a top surface;
   attaching each of the plurality of semiconductor light emitting devices to a carrier;
   attaching a plurality of wavelength converting members directly to top surfaces of the portions of growth substrate on each of the plurality of semiconductor light emitting devices, wherein the wavelength converting member is formed separately from the semiconductor light emitting device;

disposing a reflective material in areas between any two neighboring ones of the semiconductor light emitting devices, including in between their corresponding portions of the growth substrate, and between their corresponding wavelength converting members;

separating two neighboring semiconductor light emitting devices, wherein separating comprises cutting the reflective material; and after separating two neighboring semiconductor light emitting devices, removing the carrier.

5. The method of claim 1 wherein attaching a plurality of wavelength converting members directly to top surfaces of the portions of the growth substrate on each of the plurality of semiconductor light emitting devices comprises attaching the plurality of wavelength converting members to the carrier; and attaching the top surfaces of the second portion of the growth substrate to the plurality of wavelength converting members attached to the carrier.

6. A method comprising:
attaching a plurality of semiconductor light emitting devices to a carrier;
disposing a reflective material in areas between the semiconductor light emitting devices;
separating two neighboring semiconductor light emitting devices, wherein separating comprises cutting the reflective material; and
after separating two neighboring semiconductor light emitting devices, removing the carrier;
wherein after said separating two neighboring semiconductor light emitting devices, each semiconductor light emitting device comprises a growth substrate on which a semiconductor portion of the semiconductor light emitting device is grown; and
wherein disposing a reflective material in areas between the semiconductor light emitting devices comprises:
forming a mask layer on first surfaces of the semiconductor light emitting devices;
forming a reflective layer over the mask layer and sidewalls of the plurality of semiconductor light emitting devices; and
removing the mask layer.

7. The method of claim 6 further comprising forming a wavelength converting layer over the first surfaces of the semiconductor light emitting devices after removing the mask layer.

8. The method of claim 7 wherein forming a wavelength converting layer comprises using a technique selected from the group consisting of lamination, molding, spray coating, and spin coating.

9. The method of claim 7 wherein forming a wavelength converting layer comprises forming the wavelength converting layer such that it fills regions between neighboring semiconductor light emitting devices.

10. The method of claim 6 wherein the reflective layer is selected from the group consisting of a dichroic minor, a distributed Bragg reflector, a metallic film, and a dielectric stack.

11. The method of claim 6 wherein forming a reflective layer comprises using a technique selected from the group consisting of physical vapor deposition, chemical vapor deposition, sputtering, evaporation, and spray-coating.

12. The method of claim 6 wherein forming a reflective layer comprises conformally coating the plurality of semiconductor light emitting devices.

13. The method of claim 1 wherein the reflective material comprises particles disposed in a transparent material, wherein the particles and transparent material have different indices of refraction.

14. The method of claim 13 wherein the particles are selected from the group consisting of $TiO_2$, $ZnO$, and $Al_2O_3$ and the transparent material is selected from the group consisting of silicone molding compound, liquid silicone, epoxy, and glass.

15. The method of claim 2 wherein the slots have angled sidewalls.

16. The method of claim 6 wherein the wavelength converting member is selected from the group consisting of phosphor formed into a ceramic platelet and a wavelength converting material that is disposed in a transparent material formed into a sheet, then cut into individual wavelength converting members, the transparent material selected from the group consisting of glass, silicon, or epoxy.

17. The method of claim 4 wherein forming a wavelength converting layer comprises using a technique selected from the group consisting of lamination, molding, dispensing, spray coating, and spin coating.

* * * * *